United States Patent
Wakaoka et al.

(12) 
(10) Patent No.: US 11,445,636 B2
(45) Date of Patent: Sep. 13, 2022

(54) VAPOR CHAMBER, HEATSINK DEVICE, AND ELECTRONIC DEVICE

(71) Applicants: Murata Manufacturing Co., Ltd., Nagaokakyo (JP); Kelvin Thermal Technologies, Inc., Boulder, CO (US)

(72) Inventors: Takuo Wakaoka, Nagaokakyo (JP); Tatsuhiro Numoto, Nagaokakyo (JP); Keijiro Kojima, Nagaokakyo (JP); Ryan J. Lewis, Boulder, CO (US)

(73) Assignees: MURATA MANUFACTURING CO., LTD., Nagaokakyo (JP); KELVIN THERMAL TECHNOLOGIES, INC., Boulder, CO (US)

( * ) Notice: Subject to any disclaimer, the term of this patent is extended or adjusted under 35 U.S.C. 154(b) by 354 days.

(21) Appl. No.: 16/670,204

(22) Filed: Oct. 31, 2019

(65) Prior Publication Data

US 2021/0136955 A1 May 6, 2021

(51) Int. Cl.
*H05K 7/20* (2006.01)
*F28D 15/04* (2006.01)
*H01L 23/427* (2006.01)
*F28D 15/02* (2006.01)

(52) U.S. Cl.
CPC ........ *H05K 7/20336* (2013.01); *F28D 15/046* (2013.01); *F28D 15/0233* (2013.01); *F28D 15/04* (2013.01); *H01L 23/427* (2013.01)

(58) Field of Classification Search
CPC ............. H05K 7/20336; F28D 15/046; F28D 15/0233; F28D 15/04; H01L 23/427

USPC ....................................... 165/104.26, 104.33
See application file for complete search history.

(56) References Cited

U.S. PATENT DOCUMENTS

| | | | |
|---|---|---|---|
| 9,835,383 B1* | 12/2017 | Roper | F28D 15/046 |
| 9,909,814 B2 | 3/2018 | Yang et al. | |
| 10,281,220 B1 | 5/2019 | Lin et al. | |
| 2010/0157535 A1* | 6/2010 | Oniki | F28D 15/046 361/700 |
| 2012/0247736 A1* | 10/2012 | Xiang | F28D 15/0266 165/104.26 |
| 2013/0014919 A1* | 1/2013 | Dai | F28D 15/046 165/104.26 |
| 2019/0141855 A1* | 5/2019 | Inagaki | H01L 23/427 |

FOREIGN PATENT DOCUMENTS

WO 2018003957 A1 1/2018

* cited by examiner

*Primary Examiner* — Joel M Attey
(74) *Attorney, Agent, or Firm* — ArentFox Schiff LLP

(57) ABSTRACT

A vapor chamber that includes a housing including a first sheet and a second sheet opposing each other and joined together at outer edges of the first sheet and the second sheet and defining a hollow vapor flow pass therein; a working fluid in the housing; a first wick in contact with the vapor flow pass; and a second wick between the first wick and an inner wall surface of at least one of the first sheet and the second sheet. The first wick defines a first liquid flow pass, the second wick defines a second liquid flow pass, and a first average diameter of the first liquid flow pass is smaller than or equal to 75% of a second average diameter of the second liquid flow pass.

19 Claims, 7 Drawing Sheets

VAPOR CHAMBER, HEATSINK DEVICE, AND ELECTRONIC DEVICE

FIELD OF THE INVENTION

The present invention relates to a vapor chamber. The present invention also relates to a heatsink device and an electronic device including the vapor chamber.

BACKGROUND OF THE INVENTION

Highly integrated or high-performance devices have been increasing generation of heat in recent years. Further the reduction in size of products has also led to increases in heat density, so that heat dissipation measures have been becoming more important. This situation is particularly notable in the field of mobile terminals such as smartphones or tablet computers. Graphite sheets or other devices are typically used as heat dissipation measures, but they do not sufficiently transport heat. Thus, various other different heat dissipation measures have been studied. Among them, a vapor chamber, which is a planar heat pipe and can highly effectively diffuse heat, has been studied for use as a heat dissipation measure.

A vapor chamber is a planar sealed container filled with an appropriate amount of a volatile working fluid. The working fluid evaporates with heat from a heat source, travels in an internal space, and radiates heat to the outside, and then returns to a liquefied state. The liquefied working fluid is transported back toward the heat source by a capillary structure, referred to as a wick, and evaporates again. By repeating this cycle, the vapor chamber can operate in a self-sustained manner without an external power source, and two-dimensionally diffuse heat at high speed using evaporative latent heat and condensed latent heat of the working fluid.

For example, Patent Document 1 discloses a vapor chamber that includes a wick formed from a mesh and a channel. Patent Document 1 describes a combination of a nanomesh and a microchannel, by way of example.

As an example of a vapor chamber having the same structure as that in Patent Document 1, Patent Document 2 discloses a vapor chamber that includes a first wick structure and a second wick structure, which includes a groove portion and has a smaller flow pass resistance for the working fluid than the first wick structure. In the vapor chamber described in Patent Document 2, the aperture size of the first wick structure is greater than or equal to 75% of a groove width of the second wick structure, and the open area rate of the first wick structure is greater than or equal to 35%.

Patent Document 1: U.S. Pat. No. 9,909,814
Patent Document 2: International Publication No. 2018/003957

SUMMARY OF THE INVENTION

In the vapor chamber described in Patent Document 2, the first wick structure has larger flow pass resistance than the second wick structure, so that the liquid-phase working fluid is more likely to be retained in the first wick structure. On the other hand, the second wick structure has smaller flow pass resistance. Thus, the liquid-phase working fluid retained in the first wick structure or the liquid-phase working fluid condensed at a heat dissipation portion of the vapor chamber is smoothly transported by the second wick structure from the heat dissipation portion toward a heat receiving portion.

In the vapor chamber described in Patent Document 2, the aperture size of the first wick structure is greater than or equal to 75% of the groove width of the second wick structure, and the open area rate of the first wick structure is greater than or equal to 35%. Thus, the vapor-phase working fluid can smoothly move away from the aperture of the first wick structure to flow to the vapor flow pass without degrading the characteristics of condensation from the vapor-phase working fluid to the liquid-phase working fluid. Thus, the vapor chamber can achieve high heat transport capability.

In consideration of the description of Patent Document 2, to improve the heat transport capability, the vapor chamber including a combination of wicks having different flow pass diameters needs to have a wick with a smaller flow pass diameter of greater than or equal to 75% of the flow pass diameter of a wick with a larger flow pass diameter. This structure reveals that the wick with a smaller flow pass diameter improves its capability of releasing the vapor-phase working fluid, but is less likely to have capillary attraction, and thus fails to achieve a sufficiently large maximum heat transport amount for the entirety of the vapor chamber.

The present invention is made to solve the above problem, and aims to provide a vapor chamber having a large maximum heat transport amount. The present invention also aims to provide a heatsink device and an electronic device including the vapor chamber.

A vapor chamber of the present invention includes a housing including a first sheet and a second sheet opposing each other and joined together at outer edges of the first sheet and the second sheet and defining a hollow vapor flow pass therein; a working fluid in the housing; a first wick in contact with the vapor flow pass; and a second wick between the first wick and an inner wall surface of at least one of the first sheet and the second sheet. The first wick defines a first liquid flow pass that extends through the first wick in a thickness direction in which the first sheet and the second sheet oppose each other. The second wick defines a second liquid flow pass that extends in a plane direction of the second wick that is perpendicular to the thickness direction. An average diameter of the first liquid flow pass when viewed in the thickness direction is smaller than or equal to 75% of an average diameter of the second liquid flow pass when viewed in the plane direction.

A heatsink device of the present invention includes a vapor chamber of the present invention.

An electronic device of the present invention includes a vapor chamber or a heatsink device of the present invention.

The present invention can provide a vapor chamber having a large maximum heat transport amount.

DETAILED DESCRIPTION OF THE PREFERRED EMBODIMENTS

A vapor chamber according to the present invention will be described, below.

However, the present invention is not limited to the following structure, but may be applicable by being changed as appropriate within the range not departing from the gist of the present invention. A combination of any two or more separate preferable structures of the present invention described below is also included in the present invention.

Embodiments described below are mere examples. Some components of different embodiments may naturally be replaced or combined with each other. In second and following embodiments, points the same as those of the first embodiment will not be described, and only different points therebetween will be described. Particularly, the operation effects the same as those of the same components will not described in every embodiment.

In the following description, each of the vapor chambers of different embodiments will be simply referred to as "a vapor chamber of the present invention", unless otherwise particularly distinguished.

First Embodiment

Figure 1:
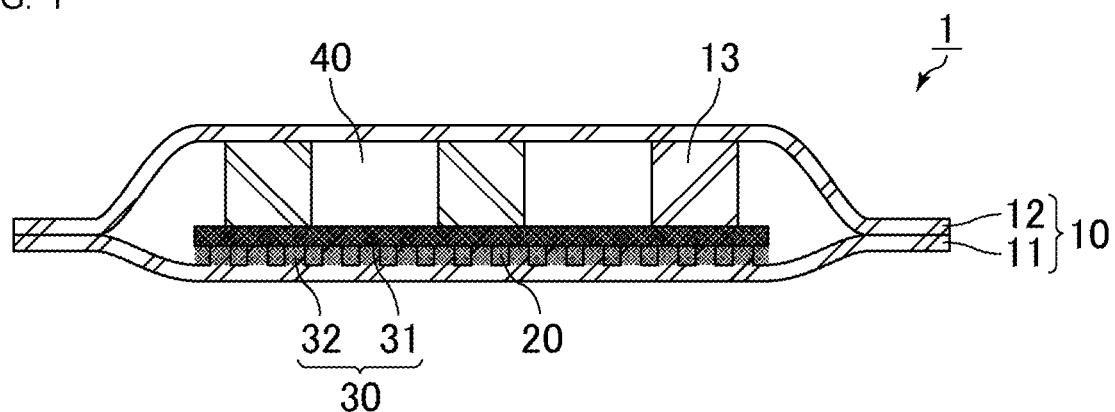
FIG. 1 is a cross-sectional view schematically illustrating an example of a vapor chamber according to a first embodiment of the present invention.
Figure 2:
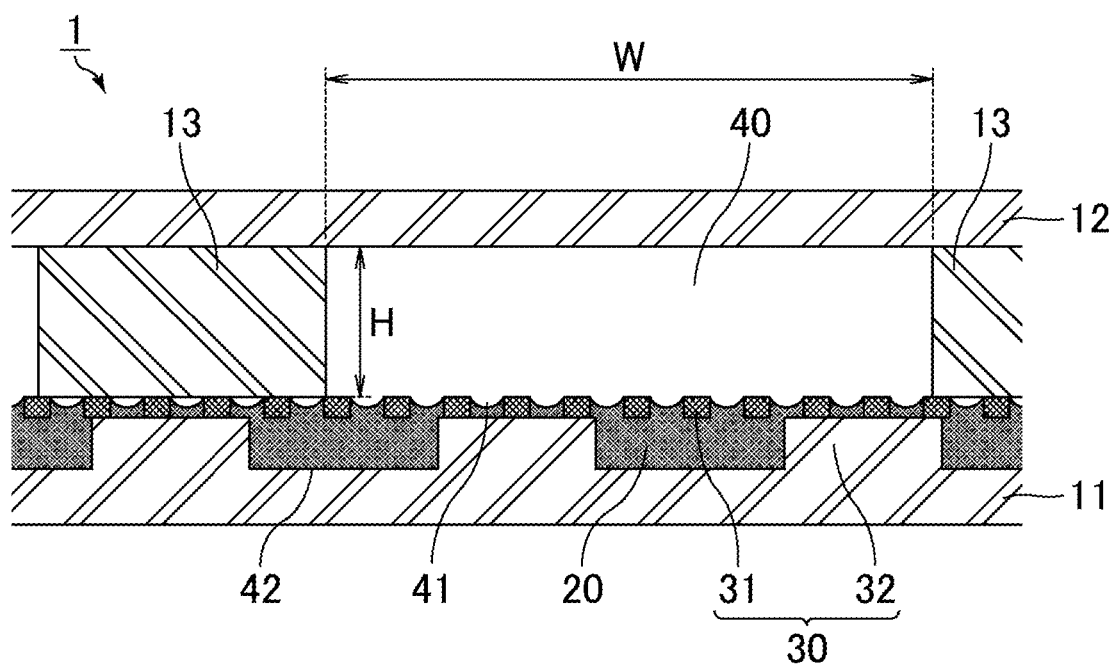
FIG. 2 is an enlarged cross-sectional view of a portion of the vapor chamber illustrated in FIG. 1.

FIG. 1 is a cross-sectional view schematically illustrating an example of a vapor chamber according to a first embodiment of the present invention. FIG. 2 is an enlarged cross-sectional view of a portion of the vapor chamber illustrated in FIG. 1.

A vapor chamber 1 illustrated in FIG. 1 includes a housing 10, including opposing first and second sheets 11 and 12, a working fluid 20 filled in the housing 10, and a wick 30 disposed on the inner wall surface of the first sheet 11. The first and second sheets 11 and 12 are joined together at their outer edges and sealed off. To support the first sheet 11 and the second sheet 12 from the inner side, multiple struts 13 are disposed between the first sheet 11 and the second sheet 12.

The housing 10 has a hollow vapor flow pass 40 defined therein. The vapor flow pass 40 is a flow pass along which the vapor-phase working fluid 20 travels, and is continuous in the plane of the housing 10. In FIG. 1, the hollow between the inner wall surface of the second sheet 12 and the wick 30 serves as the vapor flow pass 40. To define the vapor flow pass 40, the first sheet 11 and the second sheet 12 are supported by the struts 13.

The wick 30 includes a first wick 31 in contact with the vapor flow pass 40, and a second wick 32 disposed between the first wick 31 and the first sheet 11. In FIG. 1, the second wick 32 is disposed over substantially the entirety of the inner wall surface of the first sheet 11, and the first wick 31 is disposed in contact with the surface of the second wick 32.

As illustrated in FIG. 2, the first wick 31 has a first liquid flow pass 41, which extends through in the thickness direction in which the first sheet 11 and the second sheet 12 oppose each other. The first liquid flow pass 41 is a flow pass that allows the liquid-phase working fluid 20 to travel in the thickness direction. In FIG. 1 and FIG. 2, the thickness direction is a vertical direction.

The second wick 32, on the other hand, includes a second liquid flow pass 42, which extends in a plane direction perpendicular to the thickness direction. The second liquid flow pass 42 is a flow pass that allows the liquid-phase working fluid 20 to travel in the plane direction. In FIG. 1 and FIG. 2, the plane direction is a direction parallel to the inner wall surfaces of the first sheet 11 and the second sheet 12.

In a vapor chamber according to the present invention, the average diameter of the first liquid flow pass viewed in the thickness direction is smaller than or equal to 75% of the average diameter of the second liquid flow pass viewed in the direction in which the second liquid flow pass extends.

When the first liquid flow pass has an average diameter of smaller than or equal to 75% of the average diameter of the second liquid flow pass, the first liquid flow pass disposed in the first wick in contact with the liquid surface enhances its capillary attraction, and the second liquid flow pass disposed in the second wick enhances its permeability (refer to FIG. 2). Thus, the vapor chamber can enhance its maximum heat transport amount.

In a vapor chamber according to the present invention, preferably, the average diameter of the first liquid flow pass viewed in the thickness direction is smaller than or equal to 50% of the average diameter of the second liquid flow pass viewed in the direction in which the second liquid flow pass extends. Preferably, the average diameter of the first liquid flow pass viewed in the thickness direction is greater than or equal to 0.001% of the average diameter of the second liquid flow pass viewed in the direction in which the second liquid flow pass extends.

The wick disposed on the inner wall surface of the first sheet may include only the first wick and the second wick, may include a third wick between the first wick and the second wick or between the second wick and the first sheet, or may include a third wick between the first wick and the second wick and a fourth wick between the second wick and the first sheet. Specifically, the second wick may be disposed in contact with or apart from the first wick. The second wick may be disposed or not be disposed on the inner wall surface of the first sheet.

The wick disposed over the inner wall surface of the first sheet does not necessarily need to be disposed over the entirety of the inner wall surface of the first sheet, and may be disposed partially.

The wick such as the first wick or the second wick may be any wick that has a capillary structure capable of moving the working fluid with the capillary attraction. The capillary structure of the wick may be a publicly known structure used in an existing vapor chamber. Examples of the capillary structure include a fine structure having unevenness such as thin holes, grooves, or protrusions. Examples of the fine structure include a porous structure, a fibrous structure, a grooved structure, and a network structure. Any of these capillary structures constitutes a liquid flow pass such as a first liquid flow pass or a second liquid flow pass.

The material of the wick such as the first wick or the second wick is not limited to a particular one. Examples usable as the material include a metal porous membrane formed by etching or metal processing, a mesh, a nonwoven fabric, a sintered body, and a porous body. The mesh used as the material of the wick may be, for example, a metal mesh, a resin mesh, or a surface-coated metal or resin mesh. Preferably, the mesh is a copper mesh, a stainless-steel (SUS) mesh, or a polyester mesh. The sintered body used as the material of the wick may be, for example, a metal porous sintered body, or a ceramic porous sintered body. Preferably, the sintered body may be a copper or nickel porous sintered body. The porous body used as the material of the wick may be, for example, a metal porous body, a ceramic porous body, or a resin porous body.

The first wick is preferably made of a mesh or a porous body. The second wick is preferably made of multiple protrusions or recesses on the inner wall surface of the first sheet. The protrusions or recesses may be directly formed on the inner wall surface of the first sheet or may be formed by placing metal foil having protrusions or recesses on the inner wall surface of the first sheet.

The first liquid flow pass is formed from a through-hole that extends through the first wick in the thickness direction. In the present embodiment, "a diameter of a first liquid flow pass viewed in a thickness direction" refers to "a minor axis of the through-hole viewed in the thickness direction", and "an average diameter of the first liquid flow pass viewed in the thickness direction" refers to "an average of the minor axis of the through-hole viewed in the thickness direction". The shape of the through-hole viewed in the thickness direction is not limited to a particular shape. The length of a portion closest to the opposite angle is referred to as "a minor axis of a through-hole".

Figure 3:
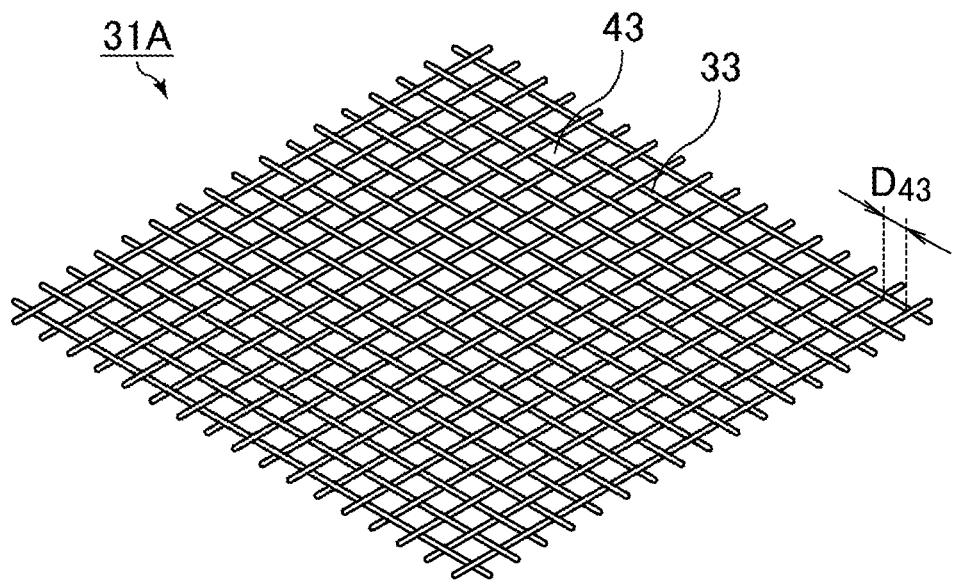
FIG. 3 is a perspective view schematically illustrating an example of a first wick.

FIG. 3 is a perspective view schematically illustrating an example of the first wick.

A first wick 31A illustrated in FIG. 3 is formed from a mesh 33. In the first wick 31A, openings 43 of the mesh 33 that extend through in the thickness direction form the first liquid flow pass. The average of the sizes of the openings 43 (length denoted with $D_{43}$ in FIG. 3) of the mesh 33 viewed in the thickness direction corresponds to the average diameter of the first liquid flow pass.

When the first wick is formed from a metal porous membrane, the through-holes that extend through in the thickness direction constitute the first liquid flow pass. Thus, the average of the minor axes of the through-holes viewed in the thickness direction corresponds to the average diameter of the first liquid flow pass.

When the first wick is formed from a nonwoven fabric, a sintered body, or a porous body, thin holes adjacent to each other in the thickness direction and continuous with each other form the first liquid flow pass. Thus, the average of the minor axes of the thin holes viewed in the thickness direction corresponds to the average diameter of the first liquid flow pass. The minor axis of each thin hole changes in the thickness direction. Thus, the minor axis of each thin hole in a cross section taken perpendicular to the thickness direction is preferably measured at any five positions.

The second liquid flow pass is formed from a hole or a gap that extends through the second wick in the plane direction. In the present description, "a diameter of the second liquid flow pass viewed in the direction in which the second liquid flow pass extends" refers to "a minor axis of a hole or a dimension of a gap viewed in the direction in which the second liquid flow pass extends", and "an average diameter of the second liquid flow pass viewed in the direction in which the second liquid flow pass extends" refers to "an average of minor axes of the holes or dimensions of the gaps viewed in the direction in which the second liquid flow pass extends". The shape of a hole or a gap viewed in the direction in which the second liquid flow pass extends is not limited. The length of a portion closest to the opposing angle refers to "a minor axis of a hole or a dimension of a gap".

Figure 4:
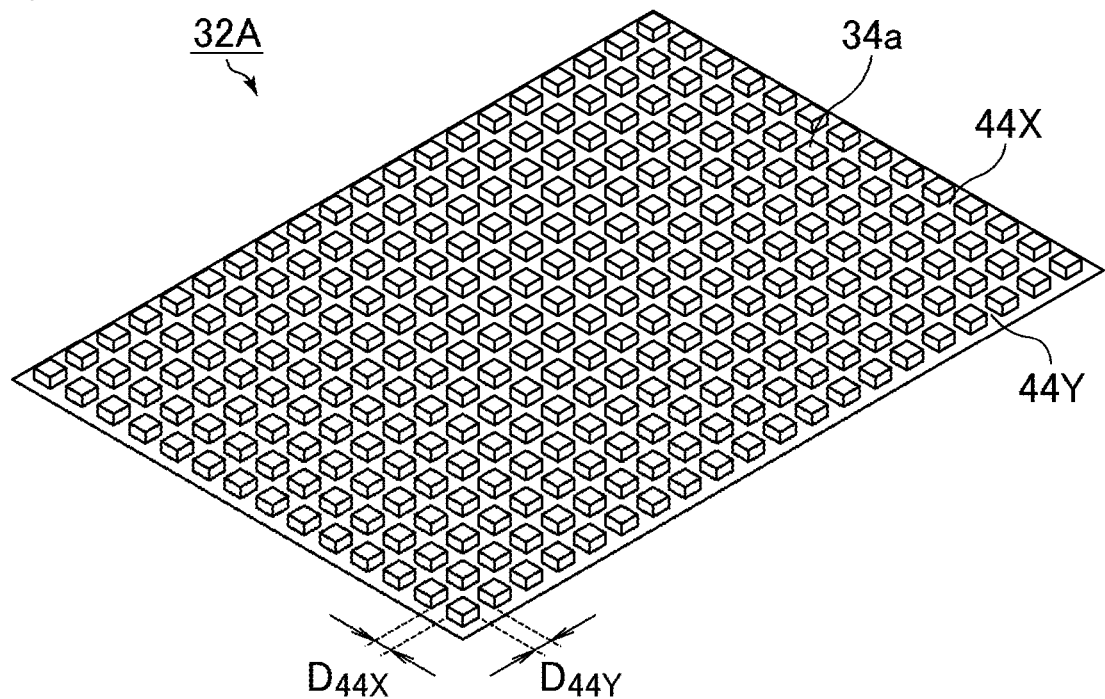
FIG. 4 is a perspective view schematically illustrating an example of a second wick including multiple protrusions.

FIG. 4 is a perspective view schematically illustrating an example of a second wick including multiple protrusions.

A second wick 32A illustrated in FIG. 4 includes multiple protrusions 34a having a substantially quadrangular prism shape. Some of the protrusions 34a are arranged in a first direction, and others are arranged in a second direction. Preferably, the first direction and the second direction are orthogonal to each other. In the second wick 32A, gaps 44X between the protrusions 34a arranged in the first direction and gaps 44Y between the protrusions 34a arranged in the second direction form a second liquid flow pass. Thus, the average of the dimensions of the gaps 44X (length denoted with $D_{44X}$ in FIG. 4 viewed in the direction in which the second liquid flow pass extends or the average of the dimensions of the gaps 44Y (length denoted with $D_{44Y}$) in FIG. 4) corresponds to the average diameter of the second liquid flow pass.

Figure 5:
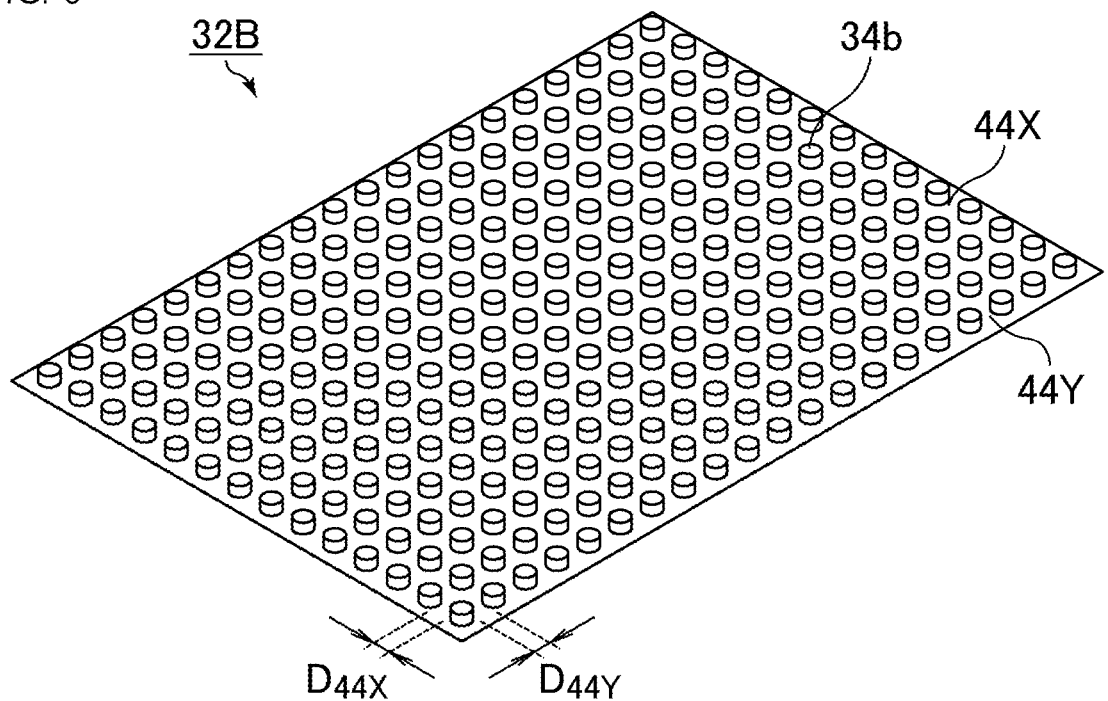
FIG. 5 is a perspective view schematically illustrating another example of a second wick including multiple protrusions.

FIG. 5 is a perspective view schematically illustrating another example of a second wick including multiple protrusions.

A second wick 32B illustrated in FIG. 5 has the same structure as the second wick 32A illustrated in FIG. 4, except that the second wick 32B includes multiple protrusions 34b having a substantially cylindrical shape.

When the second wick includes multiple protrusions, the shape of the protrusions is not limited. Examples of the shape include a prism shape such as a quadrangular prism or a pentagonal prism, a cylinder, a cylindroid, and a truncated cone.

Figure 6:
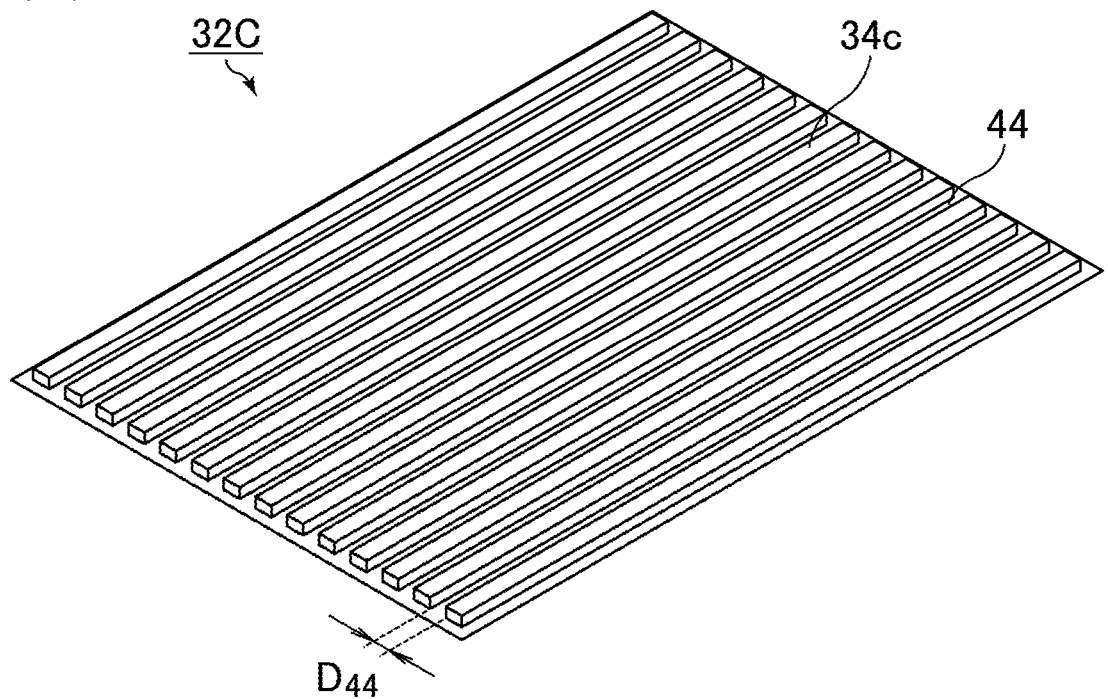
FIG. 6 is a perspective view schematically illustrating another example of a second wick including multiple protrusions.

FIG. 6 is a perspective view schematically illustrating another example of a second wick including multiple protrusions.

A second wick 32C illustrated in FIG. 6 includes multiple protrusions 34c having a substantially quadrangular prism shape. All the protrusions 34c are arranged in a uniform direction. In the second wick 32C, gaps 44 between the protrusions 34c form a second liquid flow pass. Thus, the average of the dimensions of the gaps 44 (length denoted with $D_{44}$) in FIG. 6 viewed in the direction in which the second liquid flow pass extends corresponds to the average diameter of the second liquid flow pass.

Figure 7:
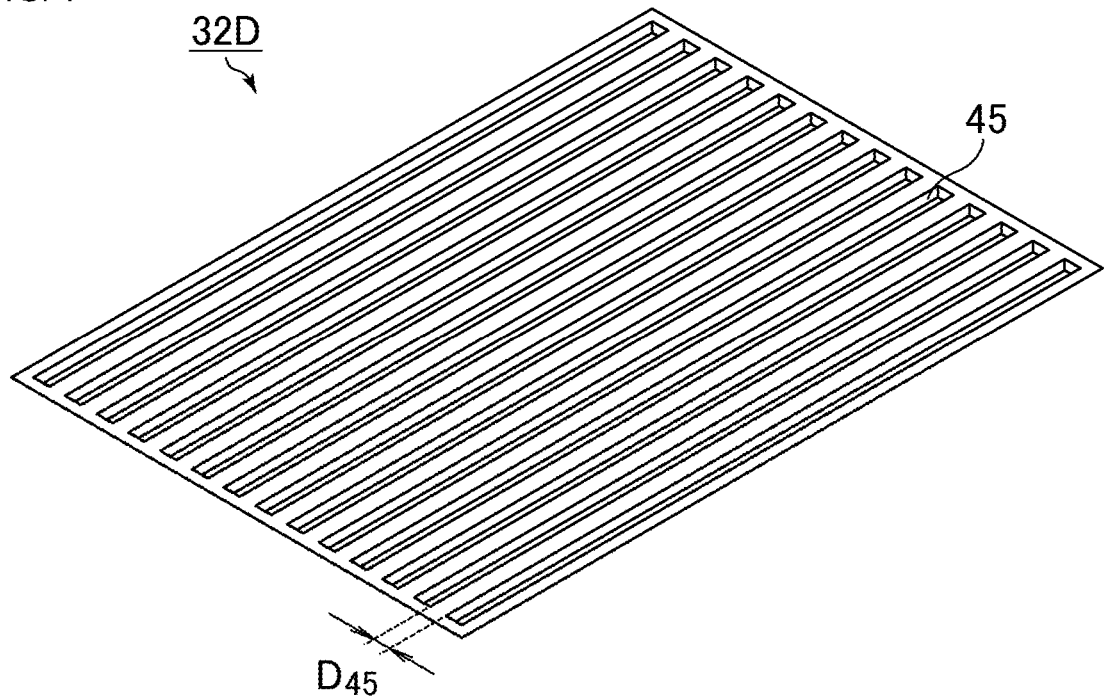
FIG. 7 is a perspective view schematically illustrating an example of a second wick including multiple grooves.

FIG. 7 is a perspective view schematically illustrating an example of a second wick including multiple grooves.

A second wick 32D illustrated in FIG. 7 includes multiple grooves 45. All the grooves 45 are arranged in a uniform direction. In the second wick 32D, the grooves 45 form a second liquid flow pass. Thus, the average of the widths of the grooves 45 (length denoted with $D_{45}$) in FIG. 7 viewed in the direction in which the second liquid flow pass extends corresponds to the average diameter of the second liquid flow pass.

Figure 8:
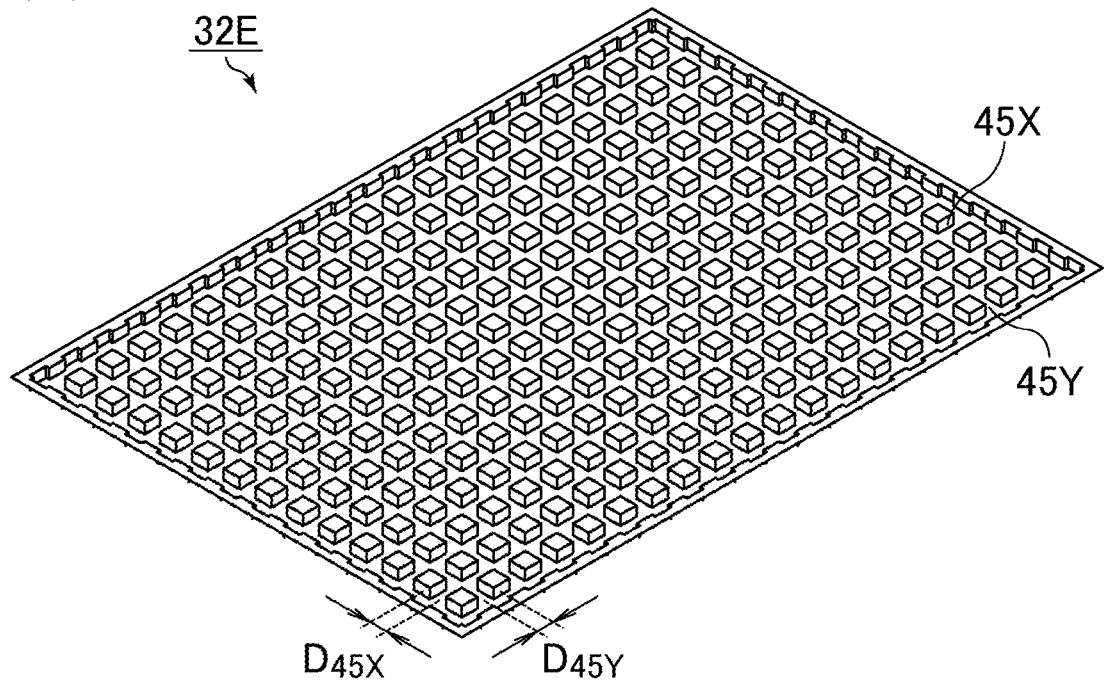
FIG. 8 is a perspective view schematically illustrating another example of a second wick including multiple grooves.

FIG. 8 is a perspective view schematically illustrating another example of a second wick including multiple grooves.

A second wick 32E illustrated in FIG. 4 includes multiple grooves 45X and 45Y. The grooves 45X are arranged in the first direction, and the grooves 45Y are arranged in the second direction. Preferably, the first direction and the second direction are orthogonal to each other. In the second wick 32E, the grooves 45X arranged in the first direction and the grooves 45Y arranged in the second direction form a second liquid flow pass. Thus, the average of the widths of the grooves 45X (length denoted with $D_{45X}$) in FIG. 4 viewed in the direction in which the second liquid flow pass extends or the average of the widths of the grooves 45Y (length denoted with $D_{45Y}$) in FIG. 4) corresponds to the average diameter of the second liquid flow pass.

When the second wick is formed from a nonwoven fabric, a sintered body, or a porous body, thin holes adjacent to each other in the plane direction and continuous with each other form the second liquid flow pass. Thus, the average of the minor axes of the thin holes viewed in the direction in which the second liquid flow pass extends corresponds to the average diameter of the second liquid flow pass. The minor axis of each thin hole changes in the direction in which the second liquid flow pass extends. Thus, the minor axis of each thin hole in a cross section taken perpendicular to the direction in which the second liquid flow pass extends is preferably measured at any five positions.

In FIG. 4, FIG. 5, and FIG. 8, the directions in which the second liquid flow pass extends are two directions, that is, a first direction and a second direction. When the second liquid flow pass extends in two or more directions, the average diameter of the first liquid flow pass viewed in the thickness direction may be smaller than or equal to 75% of the average diameter of the second liquid flow pass viewed in at least one of the directions in which the second liquid flow pass extends.

In a vapor chamber according to the present invention, when the second liquid flow pass is viewed in one direction, for every portion of the second liquid flow pass, the average diameter of the first liquid flow pass viewed in the thickness direction does not have to be smaller than or equal to 75% of the average diameter of the second liquid flow pass viewed in the direction in which the second liquid flow pass extends. Some portions that do not satisfy the above relationship may be left.

In a vapor chamber according to the present invention, the maximum diameter of the first liquid flow pass viewed in the thickness direction is preferably 1 mm or less. The maximum diameter of the first liquid flow pass viewed in the thickness direction is more preferably 0.1 mm or less. On the other hand, the minimum diameter of the first liquid flow pass viewed in the thickness direction is preferably 0.0001 mm or more.

In a vapor chamber according to the present invention, the maximum diameter of the second liquid flow pass viewed in the direction in which the second liquid flow pass extends is preferably 1 mm or less. The maximum diameter of the second liquid flow pass viewed in the direction in which the second liquid flow pass extends is more preferably 0.2 mm or less. On the other hand, the minimum diameter of the second liquid flow pass viewed in the direction in which the second liquid flow pass extends is preferably 0.0001 mm or more.

In a vapor chamber according to the present invention, when viewed in the direction in which the second liquid flow pass extends, the hydraulic diameter of the vapor flow pass is preferably larger than the hydraulic diameter of the second liquid flow pass. The hydraulic diameter of the vapor flow pass sufficiently larger than the hydraulic diameter of the second liquid flow pass hinders the liquid-phase working fluid from seeping to the vapor flow pass, and prevents hindrance to the flow of the vapor-phase working fluid, and thus the soaking characteristics can be improved.

When viewed in the direction in which the second liquid flow pass extends, the hydraulic diameter of the vapor flow pass is preferably greater than or equal to twice the hydraulic diameter of the second liquid flow pass. On the other hand, the hydraulic diameter of the vapor flow pass is preferably 20 times or less of the hydraulic diameter of the second liquid flow pass.

The hydraulic diameter of the vapor flow pass and the hydraulic diameter of the second liquid flow pass are calculated by 4×(cross section)/(perimeter) on the basis of the cross section and the perimeter of each flow pass. The cross section of the flow pass refers to the area of the shape (cross-sectional shape) of the flow pass in a cross section taken perpendicular to the direction in which the second liquid flow pass extends. The perimeter of the flow pass refers to the peripheral length (length of the closed line surrounding the cross section) of the cross-sectional shape of the flow pass. For example, as illustrated in FIG. 2, when the cross-sectional shape of each flow pass is quadrangular, the hydraulic diameter of each flow pass can be calculated by using the width W and the height H in the formula $4 \times (W \times H)/(2 \times W + 2 \times H)$. The hydraulic diameter of each flow pass changes in the direction in which the second liquid flow pass extends. Thus, preferably, the hydraulic diameter of each flow pass in a cross section taken perpendicular to the direction in which the second liquid flow pass extends is obtained at any appropriate five points.

When the second liquid flow pass extends in two or more directions, preferably, the hydraulic diameter of the vapor flow pass is larger than the hydraulic diameter of the second liquid flow pass when viewed in at least one of the two or more directions.

The hydraulic diameter of the vapor flow pass does not have to be larger than the hydraulic diameter of the second liquid flow pass at all the points in the second liquid flow pass when the second liquid flow pass is viewed in one direction. The hydraulic diameter of the vapor flow pass may be smaller than or equal to the hydraulic diameter of the second liquid flow pass at some points.

Second Embodiment

Figure 9:
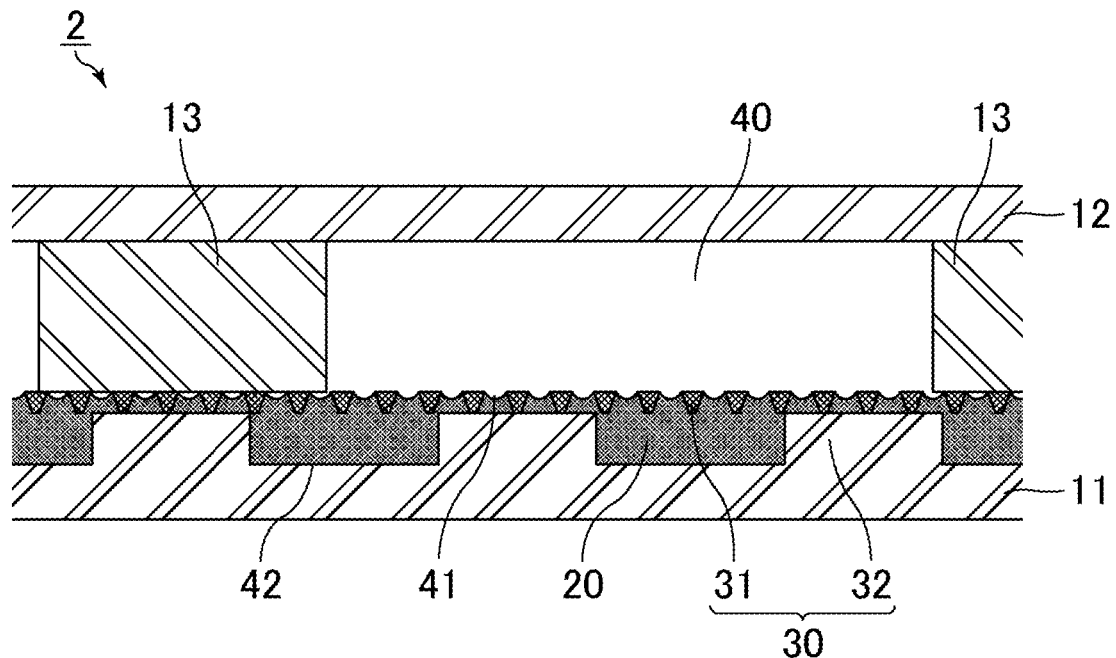
FIG. 9 is an enlarged cross-sectional view of a portion of a vapor chamber according to a second embodiment of the present invention.

FIG. 9 is an enlarged cross-sectional view of a portion of a vapor chamber according to a second embodiment of the present invention.

In a vapor chamber 2 illustrated in FIG. 9, the first wick 31 is tapered, and the diameter of the first liquid flow pass 41 decreases from the second liquid flow pass 42 toward the vapor flow pass 40. Thus, the first liquid flow pass 41 can further enhance the capillary attraction.

The first wick 31 may be tapered to allow the diameter of the first liquid flow pass 41 to increase from the second liquid flow pass 42 toward the vapor flow pass 40.

In the second embodiment of the present invention, preferably, the diameter of the first liquid flow pass in a cross section taken in the thickness direction is measured at any five points.

Third Embodiment

Figure 10:
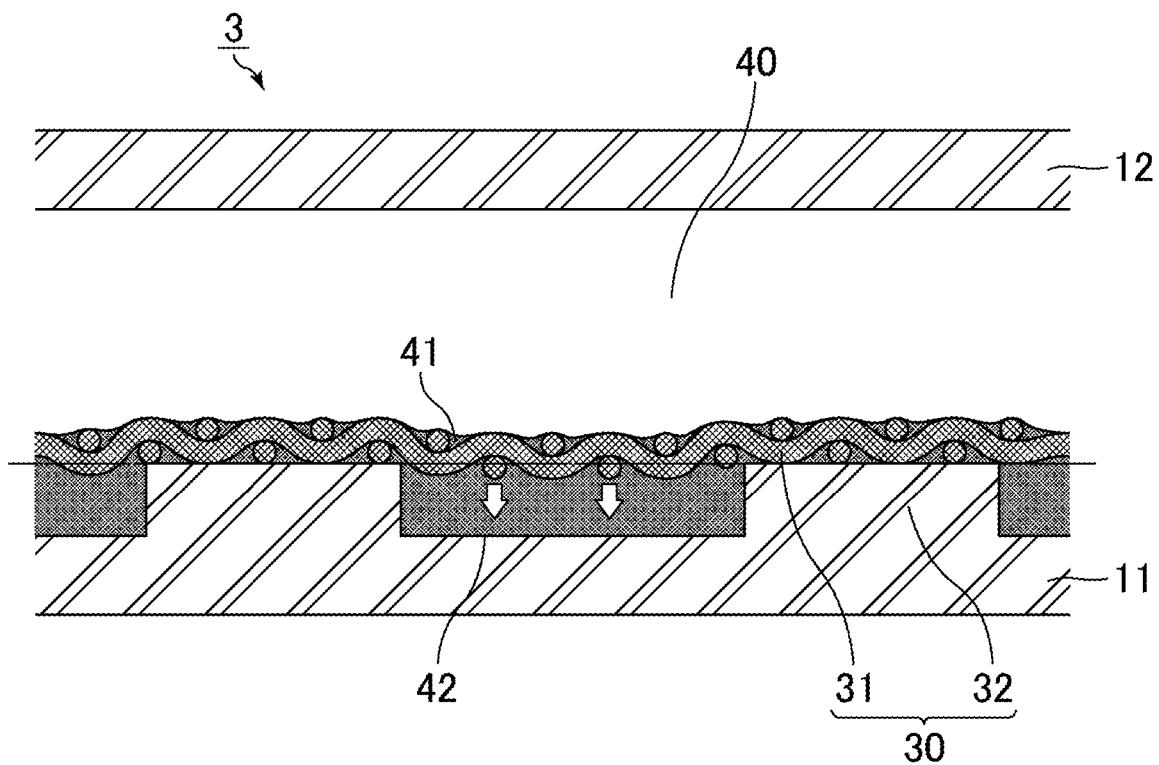
FIG. 10 is an enlarged cross-sectional view of a portion of a vapor chamber according to a third embodiment of the present invention.

FIG. 10 is an enlarged cross-sectional view of a portion of a vapor chamber according to a third embodiment of the present invention.

In a vapor chamber 3 illustrated in FIG. 10, part of the first wick 31 protrudes into the second liquid flow pass 42. This structure secures the vapor flow pass 40 and can enhance the soaking effect.

FIG. 10 illustrates an example where the first wick 31 is formed from a mesh. However, the material of the first wick 31 is not limited thereto.

Fourth Embodiment

Figure 11:
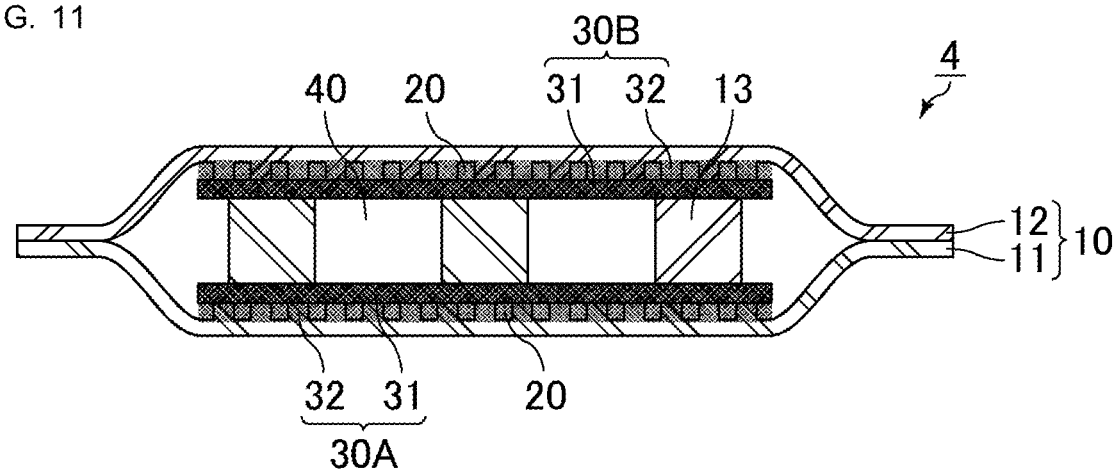
FIG. 11 is a cross-sectional view schematically illustrating an example of a vapor chamber according to a fourth embodiment of the present invention.

FIG. 11 is a cross-sectional view schematically illustrating an example of a vapor chamber according to a fourth embodiment of the present invention.

In a vapor chamber 4 illustrated in FIG. 11, wicks 30A and 30B are respectively disposed on the inner wall surfaces of the first sheet 11 and the second sheet 12. The wick 30A is disposed between the vapor flow pass 40 and the first sheet 11, and the wick 30B is disposed between the vapor flow pass 40 and the second sheet 12.

The wick 30A includes a first wick 31, which is in contact with the vapor flow pass 40, and a second wick 32, which is disposed between the first wick 31 and the first sheet 11. In FIG. 11, the second wick 32 is disposed over substantially the entirety of the inner wall surface of the first sheet 11. The first wick 31 is disposed on the surface of the second wick 32.

The wick 30B includes a first wick 31, which is in contact with the vapor flow pass 40, and a second wick 32, which is disposed between the first wick 31 and the second sheet 12. In FIG. 11, the second wick 32 is disposed over substantially the entirety of the inner wall surface of the second sheet 12. The first wick 31 is disposed on the surface of the second wick 32.

The material of the first wick of one of the wicks may be the same as or different from that of the first wick of the other wick. Similarly, the material of the second wick of one of the wicks may be the same as or different from that of the second wick of the other wick.

In the fourth embodiment according to the present invention, struts preferably support the second sheet via the wicks disposed on the inner wall surface of the second sheet without directly touching the second sheet.

Fifth Embodiment

Figure 12:
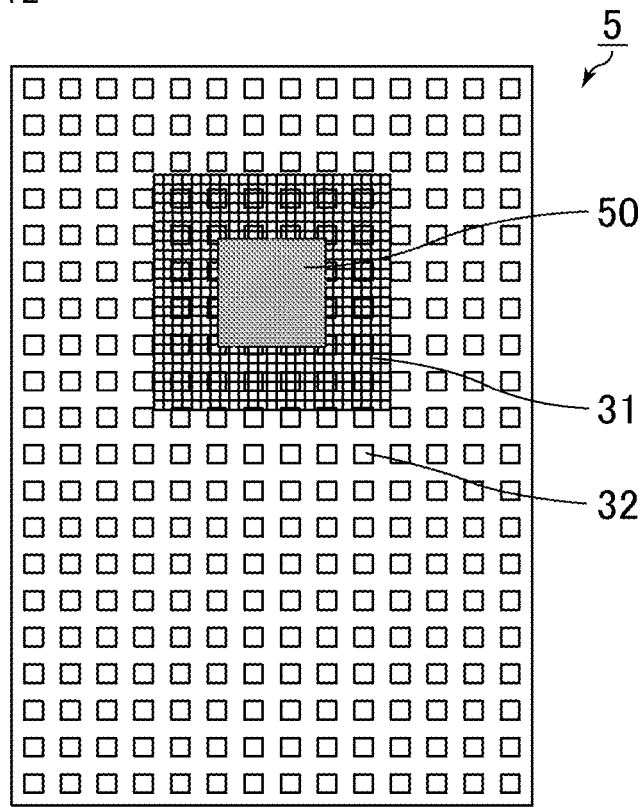
FIG. 12 is a schematic view of a vapor chamber according to a fifth embodiment of the present invention viewed in the thickness direction.

FIG. 12 is a perspective view of a vapor chamber according to a fifth embodiment of the present invention viewed in the thickness direction.

In a vapor chamber 5 illustrated in FIG. 12, when viewed in the thickness direction, the outer edge of the first wick 31 is disposed on the outer side of the outer edge of a heating element 50, which is supposed to be disposed on an outer wall surface of the first sheet or the second sheet (the first and second sheets being omitted from FIG. 12 for purposes of ease of illustration). Thus, the first wick 31 is preferably disposed to cover the heating element 50. Preferably, the first wick 31 is concentric with the heating element 50, but may not be concentric.

When viewed in the thickness direction, the area of the first wick 31 is preferably greater than or equal to twice the area of the heating element 50. Also, when viewed in the thickness direction, the area of the first wick 31 is preferably smaller than the area of the second wick 32.

The second wick 32 is preferably disposed over the entirety of the inner wall surface of the first sheet or the second sheet.

FIG. 12 illustrates an example where the first wick 31 is formed from a mesh, and the second wick 32 is formed from protrusions. However, the materials of the first wick 31 and the second wick 32 are not limited.

OTHER EMBODIMENTS

A vapor chamber according to the present invention is not limited to the above embodiments. The components of the vapor chamber, manufacturing conditions of the vapor chamber, and other properties may be changed or modified within the scope of the present invention.

In a vapor chamber according to the present invention, the housing may have any shape. Examples of the plan shape (shape viewed from above in FIG. 1) of the housing include a polygon such as a triangle or rectangle, a circle, an ellipse, and a combination of any two or more of these.

In a vapor chamber according to the present invention, the first sheet and the second sheet constituting the housing may be overlapped while having their ends aligned or misaligned.

In a vapor chamber according to the present invention, the first sheet and the second sheet may be made of any material that has characteristics appropriate for use as a vapor chamber, such as, thermal conductivity, strength, and flexibility. A preferable example of the material forming the first sheet and the second sheet is metal, such as copper, nickel, aluminum, magnesium, titanium, iron, and an alloy containing any of these as a main component. A particularly preferable example of the material of the first sheet and the second sheet is copper or a copper alloy.

In a vapor chamber according to the present invention, the first sheet and the second sheet may be made of different materials. For example, a highly strong material used for forming the first sheet can disperse the stress exerted on the housing. Different materials used for the first and second sheets allow one of the sheets to exert one function, and the other sheet to exert another function. The above functions are not limited to particular ones, but include, for example, thermal conductivity and an electromagnetic shielding function.

In a vapor chamber according to the present invention, the thicknesses of the first sheet and the second sheet are not limited. However, the first sheet and the second sheet having an extremely small thickness are more likely to be deformed with reduction of the strength of the housing. Thus, the thicknesses of the first sheet and the second sheet are preferably greater than or equal to 20 µm, and more preferably, greater than or equal to 30 µm. On the other hand, the first sheet and the second sheet having an extremely large thickness obstruct thinning of the entire vapor chamber. Thus, the thicknesses of the first sheet and the second sheet are preferably smaller than or equal to 200 µm, more preferably, smaller than or equal to 150 µm, or furthermore preferably, smaller than or equal to 100 µm. The thicknesses of the first sheet and the second sheet may be the same or different.

When the protrusions forming the wick are integrated with the first sheet, the thickness of the first sheet refers to the thickness of the portion of the first sheet not in contact with the protrusions. When the struts are integrated with the second sheet, the thickness of the second sheet refers to the thickness of the portion of the second sheet not in contact with the struts.

In a vapor chamber according to the present invention, the thickness of the first sheet may be uniform or varied to have a thick portion and a thin portion. Similarly, the thickness of the second sheet may be uniform or varied to have a thick portion and a thin portion. The portion of the second sheet not in contact with the struts may be recessed inward into the housing.

In a vapor chamber according to the present invention, a working fluid may be any fluid that can cause a vapor-liquid phase change under the environments in the housing, such as water, alcohol, or alternative CFCs. Preferably, the working fluid is a water-based compound, and more preferably, water.

In a vapor chamber according to the present invention, when the second wick includes protrusions or grooves, the height of the protrusions or the depth of the grooves is not limited. Preferably, the height or depth is 1 µm to 100 µm, more preferably, 5 µm to 50 µm, furthermore preferably, 15 µm to 35 µm.

Increasing the height of the protrusions or the depth of the grooves can increase the amount of the working fluid to be retained. Reducing the height of the protrusions or the depth of the grooves can widen the hollow through which the vapor of the working fluid travels.

Thus, adjusting the height of the protrusions can adjust the heat transport capability and the heat diffusion capability of the vapor chamber.

In a vapor chamber according to the present invention, the struts support the first sheet and the second sheet from the inner side. The struts disposed inside the housing prevent deformation of the housing when the housing is decompressed or bears an external pressure from the outside of the housing. The struts may support the first and second sheets in direct contact with the first sheet or the second sheet, or via another member, such as a wick. The struts may be integrated with the first sheet or the second sheet, or may be formed by, for example, etching the inner wall surfaces of the first sheet or the second sheet.

The struts may have any shape, for example, a cylinder, a prism, a truncated cone, or a truncated pyramid.

The struts may be arranged in any manner, but preferably, the struts are regularly arranged in a grid array, for example, to be spaced at regular intervals. Regularly arranging the struts can secure uniform strength throughout the entire vapor chamber.

A method for manufacturing a vapor chamber according to the present invention may be any method that can obtain the above structure. The above structure can be obtained by, for example, stacking the first sheet on which the wick is disposed and the second sheet on which the struts are disposed one on the other, joining the first sheet and the second sheet together while leaving an opening through which the working fluid is inserted, filling the working fluid into the housing through the opening, and then closing the opening.

A method for joining the first sheet and the second sheet together is not limited to a particular one. Examples of the method include laser welding, resistance welding, diffusion bonding, brazing and soldering, tungsten inert-gas arc welding (TIG arc welding), ultrasonic bonding, and plastic sealing. Among these, laser welding, resistance welding, or brazing and soldering is preferable.

A vapor chamber according to the present invention can be mounted on a heatsink device to be adjacent to the heat source. Thus, a heatsink device including a vapor chamber according to the present invention is also included in the present invention. A heatsink device including a vapor chamber according to the present invention can effectively prevent a temperature rise of a heating electronic component and the surroundings of the component.

A vapor chamber or a heatsink device according to the present invention can be mounted on an electronic device for thermal dissipation. Thus, an electronic device including a vapor chamber or a heatsink device according to the present invention is also included in the present invention. Examples of an electronic device according to the present invention include a smartphone, a tablet computer, a laptop computer, a game machine, and a wearable device. As described above, a vapor chamber according to the present invention can operate in a self-sustained manner without an external power, and two-dimensionally diffuse heat at high speed using evaporative latent heat and condensed latent heat of the working fluid. Thus, the electronic device including a vapor chamber or a heatsink device according to the present invention can effectively achieve thermal dissipation in a limited space inside the electronic device.

EXAMPLES

Hereinbelow, specific examples of a vapor chamber according to the present invention will be described. The present invention is not limited to these examples.

Examples 1 to 4 and Comparative Example 1

A piece of copper foil with, when viewed in a plan, a width of 60 mm, a length of 100 mm, and a thickness of 0.08 mm was prepared as a first sheet. The first sheet was etched using sodium persulfate to form protrusions constituting a second wick on the inner wall surface. The protrusions had a quadrangular prism shape, and were spaced 75 µm, 150 µm, 200 µm, or 300 µm between adjacent protrusions.

Separately, a piece of copper foil with, when viewed in a plan, a width of 60 mm, a length of 100 mm, and a thickness of 0.2 mm was prepared as a second sheet. The second sheet was etched using sodium persulfate to form cylindrical struts on the inner wall surface.

The first wick was disposed to be held between the first sheet including the protrusions and the second sheet including the struts, and then sealed by subjecting the outer edge of the first sheet and the outer edge of the second sheet to laser welding. A stainless steel mesh #290 or #500 was used as the first wick.

After welding, the working fluid was filled in through a pipe. Thus, vapor chambers of Examples 1 to 4 and Comparative Example 1 were obtained.

Figure 13:
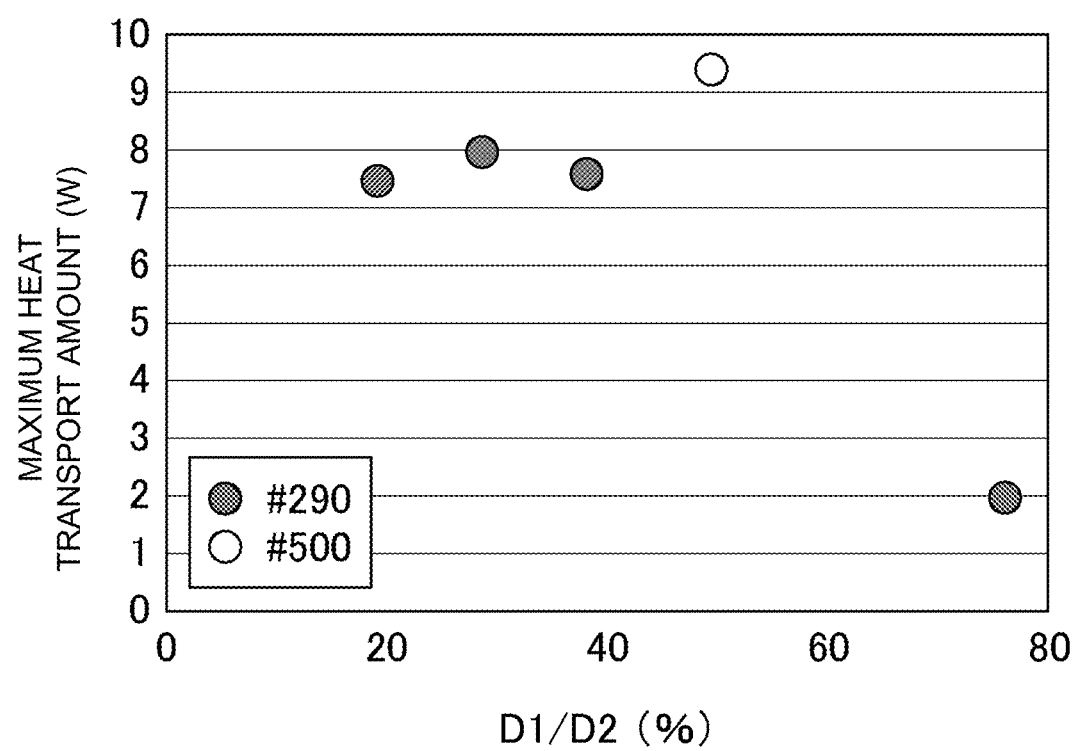
FIG. 13 is a graph showing the relationship between the proportion of D1/D2 and the maximum heat transport amount.

For the vapor chambers of Examples 1 to 4 and Comparative Example 1, Table 1 shows the maximum heat transport amount and the proportion of D1/D2, where the mesh opening dimension corresponding to the average diameter of the first liquid flow pass is denoted with D1, and the distance between the protrusions corresponding to the average diameter of the second liquid flow pass is denoted with D2. FIG. 13 shows a graph of the relationship between the proportion of D1/D2 and the maximum heat transport amount.

The maximum heat transport amount refers to an amount of heat input from a ceramic heater of 1.5 cm×1.5 cm disposed at the middle of one short side of the vapor chamber, when the temperature of the surface of the housing opposite to the surface on which the ceramic heater is disposed rises to a temperature higher by at least 5° C. than the temperature at the center portion of the vapor chamber with an increase of the amount of heat input from the heater.

TABLE 1

|  | Mesh | D1/D2 | Maximum Heat Transport Amount (W) |
|---|---|---|---|
| Example 1 | #290 | 19% | 7.50 |
| Example 2 | #290 | 29% | 8.10 |
| Example 3 | #290 | 38% | 7.62 |
| Example 4 | #500 | 49% | 9.43 |
| Comparative Example 1 | #290 | 76% | 2.03 |

Table 1 and FIG. 13 reveal that the maximum heat transport amount significantly decreases when D1/D2 reaches or exceeds 75%.

Comparative Example 2

A piece of copper foil with, when viewed in a plan, a width of 60 mm, a length of 100 mm, and a thickness of 0.08 mm was prepared as a first sheet. The first sheet had no protrusions on the inner wall surface.

Separately, a piece of copper foil with, when viewed in a plan, a width of 60 mm, a length of 100 mm, and a thickness of 0.2 mm was prepared as a second sheet. The second sheet was etched using sodium persulfate to form cylindrical struts on the inner wall surface.

A wick was disposed to be held between the first sheet including no protrusions and the second sheet including the struts, and then sealed by subjecting the outer edge of the first sheet and the outer edge of the second sheet to laser welding. A stainless steel mesh #500 was used as the wick.

After welding, the working fluid was filled through a pipe. Thus, a vapor chamber of Comparative Example 2 was obtained.

The maximum heat transport amount of the vapor chamber of Comparative Example 2 was 3.1 W.

Comparative Example 3

A piece of copper foil with, when viewed in a plan, a width of 60 mm, a length of 100 mm, and a thickness of 0.08 mm was prepared as a first sheet. The first sheet was etched using sodium persulfate to form protrusions constituting a second wick on the inner wall surface. The protrusions had a quadrangular prism shape, and were spaced 50 μm between adjacent protrusions.

Separately, a piece of copper foil with, when viewed in a plan, a width of 60 mm, a length of 100 mm, and a thickness of 0.2 mm was prepared as a second sheet. The second sheet was etched using sodium persulfate to form cylindrical struts on the inner wall surface.

The first wick was disposed to be held between the first sheet including the protrusions and the second sheet including the struts, and then sealed by subjecting the outer edge of the first sheet and the outer edge of the second sheet to laser welding. A stainless steel mesh #290 was used as the first wick.

After welding, the working fluid was filled through a pipe. Thus, a vapor chamber of Comparative Example 3 was obtained.

The maximum heat transport amount of the vapor chamber of Comparative Example 3 was 3.2 W.

A vapor chamber, a heatsink device, and an electronic device according to the present invention are usable to a wide range of purposes in the field of, for example, personal digital assistants. They are usable to, for example, lower the temperature of a heat source such as a CPU to extend the operating time of an electronic device, and applicable to, for example, a smartphone, a tablet computer, or a laptop computer.

REFERENCE SIGNS LIST 1, 2, 3, 4, 5: vapor chamber
10: housing
11: first sheet
12: second sheet
13: strut
20: working fluid
30, 30A, 30B: wick
31, 31A: first wick
32, 32A, 32B, 32C, 32D, 32E: second wick
33: mesh
34a, 34b, 34c: protrusion
40: vapor flow pass
41: first liquid flow pass
42: second liquid flow pass
43: mesh opening
44, 44X, 44Y: gap between protrusions
45, 45X, 45Y: groove
50: heating element
$D_{43}$: mesh opening dimension
$D_{44}$, $D_{44X}$, $D_{44Y}$: dimension of gap between protrusions
$D_{45}$, $D_{45X}$, $D_{45Y}$: groove width

What is claimed is:
1. A vapor chamber, comprising:
a housing including a first sheet and a second sheet opposing each other and joined together at outer edges of the first sheet and the second sheet and defining a hollow vapor flow pass therein;
a working fluid in the housing;
a first wick in contact with the vapor flow pass; and
a second wick between the first wick and an inner wall surface of at least one of the first sheet and the second sheet,
wherein the first wick defines a first liquid flow pass that extends through the first wick in a thickness direction in which the first sheet and the second sheet oppose each other,
wherein the second wick defines a second liquid flow pass that extends in a plane direction of the second wick that is perpendicular to the thickness direction, and
wherein a first average diameter of the first liquid flow pass when viewed in the thickness direction is smaller than or equal to 50% of a second average diameter of the second liquid flow pass when viewed in the plane direction.

2. The vapor chamber according to claim 1, wherein, when viewed in the plane direction, a first hydraulic diameter of the vapor flow pass is larger than a second hydraulic diameter of the second liquid flow pass.

3. The vapor chamber according to claim 1,
wherein a maximum diameter of the first liquid flow pass when viewed in the thickness direction is 1 mm or less, and
wherein a maximum diameter of the second liquid flow pass when viewed in the plane direction is 1 mm or less.

4. The vapor chamber according to claim 1, wherein a diameter of the first liquid flow pass decreases in a direction from the second liquid flow pass toward the vapor flow pass.

5. The vapor chamber according to claim 1, wherein at least a part of the first wick protrudes into the second liquid flow pass.

6. The vapor chamber according to claim 1, further comprising one or more struts between the first sheet and the second sheet and which also define the hollow vapor flow pass within the housing.

7. The vapor chamber according to claim 1, wherein, when viewed in the thickness direction, an outer edge of the first wick is arranged so as to enclose a heating element that is to be disposed on an outer wall surface of the first sheet or the second sheet, and the first wick has an area that is greater than or equal to twice an area of the heating element.

8. The vapor chamber according to claim 1, wherein, when viewed in the thickness direction, a first area of the first wick is smaller than a second area of the second wick.

9. The vapor chamber according to claim 1, wherein the first wick comprises a mesh and the second wick comprises protrusions or grooves.

10. A vapor chamber, comprising:
a housing including a first sheet and a second sheet opposing each other and joined together at outer edges of the first sheet and the second sheet and defining a hollow vapor flow pass therein;
a working fluid in the housing;
a first wick in contact with the vapor flow pass; and
a second wick between the first wick and an inner wall surface of at least one of the first sheet and the second sheet,
wherein the first wick defines a first liquid flow pass that extends through the first wick in a thickness direction in which the first sheet and the second sheet oppose each other,
wherein the second wick defines a second liquid flow pass that extends in a plane direction of the second wick that is perpendicular to the thickness direction,
wherein a first average diameter of the first liquid flow pass when viewed in the thickness direction is smaller than or equal to 75% of a second average diameter of the second liquid flow pass when viewed in the plane direction, and
wherein the second wick is disposed on the inner wall surface of the first sheet; and the vapor chamber further comprises:
a third wick in contact with the vapor flow pass; and
a fourth wick between the third wick and an inner wall surface of the second sheet.

11. The vapor chamber according to claim 10,
wherein the third wick defines a third liquid flow pass that extends through the third wick in a thickness direction in which the first sheet and the second sheet oppose each other,
wherein the fourth wick defines a fourth liquid flow pass that extends in a plane direction of the fourth wick that is perpendicular to the thickness direction in which the first sheet and the second sheet oppose each other, and
wherein a third average diameter of the third liquid flow pass when viewed in the thickness direction in which the first sheet and the second sheet oppose each other is smaller than or equal to 75% of a fourth average diameter of the fourth liquid flow pass when viewed in the plane direction of the fourth wick.

12. The vapor chamber according to claim 11, wherein, when viewed in the plane direction of the fourth wick, a first hydraulic diameter of the vapor flow pass is larger than a second hydraulic diameter of the fourth liquid flow pass.

13. The vapor chamber according to claim 11,
wherein a maximum diameter of the third liquid flow pass when viewed in the thickness direction in which the first sheet and the second sheet oppose each other is 1 mm or less, and
wherein a maximum diameter of the fourth liquid flow pass when viewed in the plane direction of the fourth wick is 1 mm or less.

14. The vapor chamber according to claim 11, wherein a first average diameter of the third liquid flow pass when viewed in the thickness direction in which the first sheet and the second sheet oppose each other is 50% or less of a second average diameter of the second liquid flow pass when viewed in the plane direction of the fourth wick.

15. The vapor chamber according to claim 10, wherein a diameter of the third liquid flow pass decreases in a direction from the fourth liquid flow pass toward the vapor flow pass.

16. The vapor chamber according to claim 10, wherein at least a part of the third wick protrudes into the fourth liquid flow pass.

17. The vapor chamber according to claim 10, further comprising one or more struts between the first wick and the third wick, and which also define the hollow vapor flow pass within the housing.

18. A heatsink device, comprising:
a heatsink; and
the vapor chamber according to claim 1 mounted on the heatsink.

19. An electronic device, comprising:
a heat source; and
the vapor chamber according to claim 1 arranged so as to thermally dissipate heat from the heat source.

* * * * *